United States Patent
Tsai et al.

(10) Patent No.: US 10,461,723 B2
(45) Date of Patent: Oct. 29, 2019

(54) FULL RANGE REALIGNMENT RING OSCILLATOR

(71) Applicant: Taiwan Semiconductor Manufacturing Co., Ltd., Hsinchu (TW)

(72) Inventors: Tsung-Hsien Tsai, Zhongli (TW); Chen-Hsiang Hsieh, Taipei (TW); Ruey-Bin Sheen, Taichung (TW); Chih-Hsien Chang, New Taipei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 50 days.

(21) Appl. No.: 15/826,910

(22) Filed: Nov. 30, 2017

(65) Prior Publication Data
US 2019/0165769 A1    May 30, 2019

(51) Int. Cl.
*H03K 3/03* (2006.01)
*H03K 3/356* (2006.01)
*H03L 7/081* (2006.01)
*H03L 7/087* (2006.01)
*H03L 7/099* (2006.01)

(52) U.S. Cl.
CPC ......... *H03K 3/0322* (2013.01); *H03K 3/0315* (2013.01); *H03K 3/356034* (2013.01); *H03L 7/081* (2013.01); *H03L 7/087* (2013.01); *H03L 7/0995* (2013.01)

(58) Field of Classification Search
CPC ... H03K 3/0315; H03K 3/0322; H03L 7/0995

USPC .......................................................... 331/57
See application file for complete search history.

(56) References Cited

U.S. PATENT DOCUMENTS

| | | | | |
|---|---|---|---|---|
| 4,820,936 A | * | 4/1989 | Veendrick | G05F 3/205 327/198 |
| 5,677,649 A | * | 10/1997 | Martin | G11C 5/145 327/536 |
| 2004/0135601 A1 | * | 7/2004 | Aman | H03K 3/0315 327/116 |
| 2005/0122178 A1 | * | 6/2005 | Goto | H03K 3/011 331/57 |

(Continued)

*Primary Examiner* — Levi Gannon
(74) *Attorney, Agent, or Firm* — Duane Morris LLP (57) ABSTRACT

A realignment ring-cell circuit is disclosed. The circuit includes a single-to-differential unit, an OR gate, an AND gate, a first P-type metal-oxide-semiconductor transistor, and a first N-type metal-oxide-semiconductor transistor. The single-to-differential unit has an input configured to receive a realignment signal, a first output for outputting a first differential output and a second output for outputting a second differential output. The first output for outputting is a first input to the OR gate. The second output for outputting is a first input to the AND gate. A gate of the P-type metal-oxide-semiconductor transistor is electrically connected to an output of the OR gate. A gate of the N-type metal-oxide-semiconductor transistor is electrically connected to an output of the AND gate. A drain of the P-type metal-oxide-semiconductor transistor and a drain of the N-type metal-oxide-semiconductor transistor are electrically connected to each other and are further electrically connected to a second input of the OR gate and a second input of the AND gate.

20 Claims, 10 Drawing Sheets

(56) References Cited

U.S. PATENT DOCUMENTS

2018/0241379 A1* 8/2018 Murphy ............. H03K 5/15013
2019/0028108 A1* 1/2019 Gao ........................ H03D 3/24

* cited by examiner

FULL RANGE REALIGNMENT RING OSCILLATOR

BACKGROUND

A phase frequency detector (PFD) is a device which compares the phase of two input signals. The PFD includes two inputs for receiving two different input signals, respectively, usually one from a voltage-controlled oscillator (VCO) and another from other external sources. The PFD has two outputs which instruct subsequent circuitry how to adjust the frequency to lock onto the phase of the reference signal. To form a phase-locked loop (PLL), a PFD phase error output is transmitted to a loop filter which integrates the signal to smooth it. The smoothed signal is transmitted to a VCO which generates an output signal with a frequency that is proportional to the input voltage. The VCO output is also transmitted back to the PFD to lock to the phase of the reference signal.

A pump converts the PFD digital phase error to an analog charge. The PFD and pump of a traditional tracking loop (i.e., signal path) is disabled when the PLL operates in a realignment mode. As a result, the PLL is not capable of recovering the target frequency in realignment mode when the PLL suffers from temperature variation. In order to recover the target frequency, the traditional tracking loop is enabled. When a traditional loop and a realignment loop are enabled together, two instructions are injected into a ring oscillator of the PLL at the same time to create a loop conflict, which refers to a situation when there is a traditional tracking loop and a realignment loop in the circuit. In conventional approaches, the conflict is controlled by adjusting the strength of realignment. The realignment improves integrated jitter of the PLL by aligning the phase of the ring oscillator with the reference clock. When the PLL operates in the realignment mode, the PFD and pump of a traditional tracking loop is disabled to avoid a loop conflict. In this scenario, the PLL frequency cannot be recovered in realignment mode when the PLL suffers temperature variation when the tracking loop is disabled. As a result, the traditional tracking loop must be enabled to trace a target frequency when the PLL suffers temperature variation.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION OF EXEMPLARY EMBODIMENTS

The following disclosure provides many different embodiments, or examples, for implementing different features of the subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

When a traditional tracking loop and a realignment loop are enabled in a PLL circuit, two instructions are injected into a ring oscillator of the PLL at the same time to create a loop conflict. The worst case scenario conflict occurs at the realignment strength of 1:1, which creates spurs at high frequency. As discussed in further detail below, "realignment strength", also known as loop weight, reflects the relative strength between the traditional tracking loop and the realignment loop. A "spur" is a peak in the log-log plot of the power spectral density figure. In order to reduce conflict and improve integrated jitter, the realignment strength can be adjusted. A weak realignment reduces the conflict between two loops, however, the corresponding rise in integrated jitter poses problems. A strong realignment suppresses the in-band noise of PLL, but the out-band spur is generated by a strong conflict to degrade integrated jitter.

In one example, a realignment circuit may receive an external signal FREF (reference clock) to align the edge of the oscillator. A realignment ring oscillator can include a multiplexer and a ring oscillator with five inverters serially connected to each other. The multiplexer is implemented in the ring oscillator to control the connection and disconnection of the loop of the ring oscillator. One input of the multiplexer is connected to an output of a pulse generator, which provides a realignment selector signal (RL_S). The pulse generator includes a first inverter and a second inverter serially connected to each other, and then further connected to an input of a XOR gate. The other input of the XOR gate is connected to FREF and the input of the first inverter.

A low level of the realignment selector signal (RL_S) sets the multiplexer to operate at path "0" and the multiplexer connects the loop of the ring oscillator for enabling the ring oscillator. When the multiplexer is set at path "1" by the high level of RL_S, the loop is disconnected from the ring oscillator.

In one example, a rising edge of a realignment pulse is within a negative cycle of a pulse signal. An active region in this example corresponds to the negative cycles (when the signal is low) of the pulse signal, and negative cycle is one such active region in which a realignment pulse will realign the pulse signal with the realignment pulse. In another example, the rising edge falls within the positive cycle (when the signal is high) of the pulse signal, and the positive cycles are static regions. As a comparison to the active regions discussed above, a realignment pulse, e.g. the realignment pulse that is introduced in the static region, will not realign the pulse signal. Further details regarding the active region and static region will be discussed below.

When a selector signal RL_S, provided to an input of multiplexer, is at a low level, the output of the multiplexer is selected to run through an internal ring path. When the rising edge of the selector signal RL_S arrives (high level), the multiplexer is selected to break the path of the ring oscillator. The phase of ring oscillator is aligned by the rising edge of the selector signal RL_S. The RL_S signal is generated by the pulse generator from a reference clock FREF, and as a result, the phase of RL_S is also referenced to the phase of the reference clock.

An active region of the pulse is in the negative period of the pulse generated by the pulse generator, and the realigning pulse, with a rising edge, can be injected into ring oscillator to align a rising edge of signal of the ring oscillator to be in phase with a rising edge of the realigning pulse, to provide a realigned signal with an adjusted rising edge that is in phase with the reference clock FREF, which is in phase with the realignment pulse. In addition, the realignment pulse also resets the accumulated jitter of ring oscillator because now the rising edge is in phase with the rising edge of the realignment pulse.

As discussed above, a static region is in a positive period of the ring oscillator. When a realignment pulse is provided during the static region of the oscillator, the realign pulse cannot affect the waveform of the ring oscillator in the static region because the selector signal RL_S switches off the multiplexer. In addition, the realigning pulse does not align the oscillator phase to the reference clock FREF for resetting accumulated jitter because the selector signal RL_S switches off the multiplexer.

If the ring oscillator suffers power noise, the phase and period of the ring oscillator receives variations which cause the realigning pulse to move out of the active region and into the static region. When the realigning pulse shifts from the active region into the static region, the ring oscillator is not able to reset the accumulated jitter by aligning the phase. As a result, the in-band noise cannot be suppressed by realigning pules. Because the active region only occupies 50% of the entire cycle, the ring oscillator only has a 50% chance for reducing the in-band noise.

For the ring oscillator, in the active region, the RL_S signal can be injected into the ring cells to align the phase of ring oscillator with the reference clock FREF. And as a result, the accumulated jitter is reset by RL_S. While in the static region, the RL_S signal does not affect the waveform of the ring oscillator. And as a result, the phase of the ring oscillator cannot be aligned and the accumulated jitter of ring oscillator cannot be reset.

Figure 1:
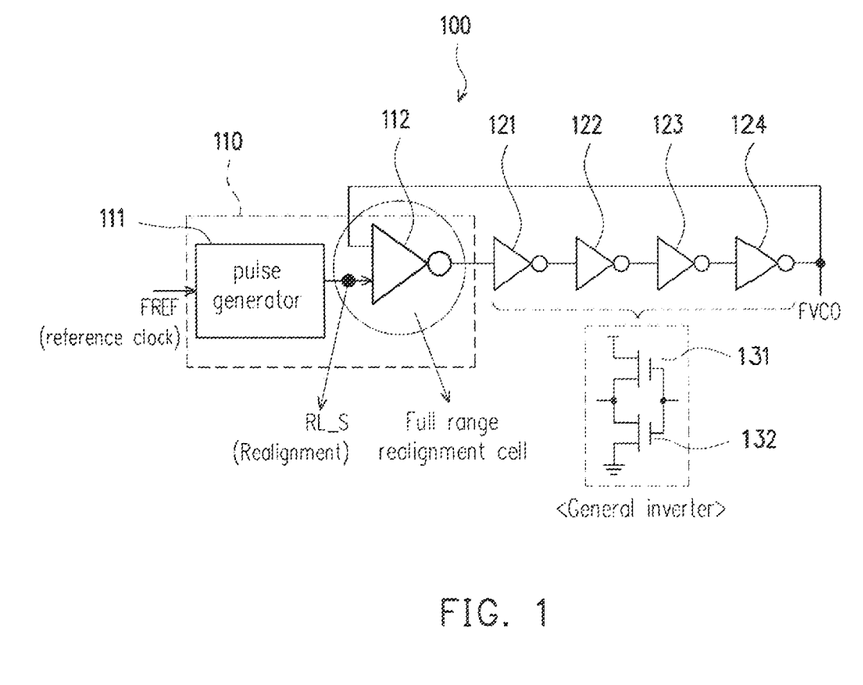
FIG. 1 is a schematic illustration of a full-range realignment ring-oscillator, in accordance with some embodiments.

FIG. 1 is a schematic illustration of a full-range realignment ring-oscillator, in accordance with some embodiments. According to some embodiments, the full-range realignment ring-oscillator 100 includes four inverters 121, 122, 123 and 124 serially connected to each other, and a full range realignment cell 112. The structure of the full range realignment cell 112 is discussed in further detail below with reference to FIG. 4. According to some embodiments, the four inverters 121, 122, 123 and 124 each have a typical structure with two transistors: one PMOS transistor 131 and one NMOS transistor 132. The drains of the PMOS 131 and the NMOS 132 are electrically connected together as the input of the inverter. The gates of the PMOS 131 and the NMOS 132 are electrically connected together as the output of the inverter. The pulse generator 111 is discussed in further detail below with reference to FIGS. 2 and 3.

The RL_S is generated by pulse generator 111 from the reference clock FREF. The low level of RL_S enables the oscillator loop and the high level of RL_S breaks the loop of oscillator and inject the phase of RL_S into ring oscillator for the phase alignment. The full range realignment cell 112 has two functions: when RL_S is at low level, the full range realignment cell 112 is a general inverter; when RL_S is at high level, the full range realignment cell 112 forces the RL_S to be injected into the ring oscillator 100, as discussed in further detail below with respect to FIG. 4.

Figure 2:
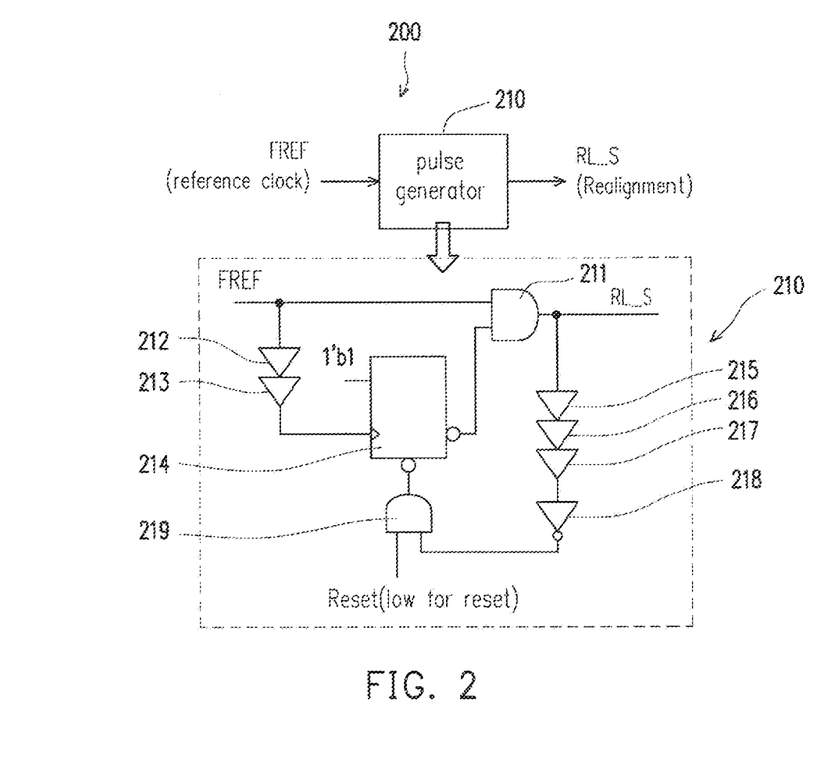
FIG. 2 is a schematic illustration of a pulse generator of realignment, in accordance with some embodiments.

FIG. 2 is a schematic illustration of a pulse generator for use in a realignment circuit, in accordance with some embodiments. As illustrated in FIG. 2, according to some embodiments, the pulse generator 310 includes a first buffer train with amplifiers 212 and 213 electrically connected in serial. The pulse generator 210 also includes an AND gate 211, the input of the amplifier 212 and one input of the AND gate 211 are electrically connected together and connected to FREF signal. The output of the amplifier 213 is electrically connected to an input of a data latch 214. The output of the data latch 214 is inverted and is connected to the other input of the AND gate 211. The output of the AND gate 211 is electrically connected to the RL_S signal. The output of the AND gate 211 is also electrically connected to a second buffer train with three amplifiers connected in serial: 215, 216 and 217. The output of the second buffer train is transmitted to an inverter 218, the inverter 218 is electrically connected an input of a second AND gate 219, and the other input of the second AND gate 219 is connected to a Reset signal source. The inverted output of the second AND gate 219 is electrically connected to the data latch 214.

According to some embodiments, the pulse generator 210 obtains a rising edge output immediately (RL_S) as it receives an incoming signal at rising edge; the FREF goes through the first buffer train to trigger the data latch 214 for generating an output of low level from a previous high level. The RL_S is dropped to a low level from the output of AND gate 211 and RL_S goes through the combination of the second buffer train and the inverter 218 to reset the data latch 214. After resetting the data latch 214, the output of the data latch 214 returns to the default of high level. As a result, the pulse waveform of RL_S is generated by the pulse generator 210.

Figure 3:
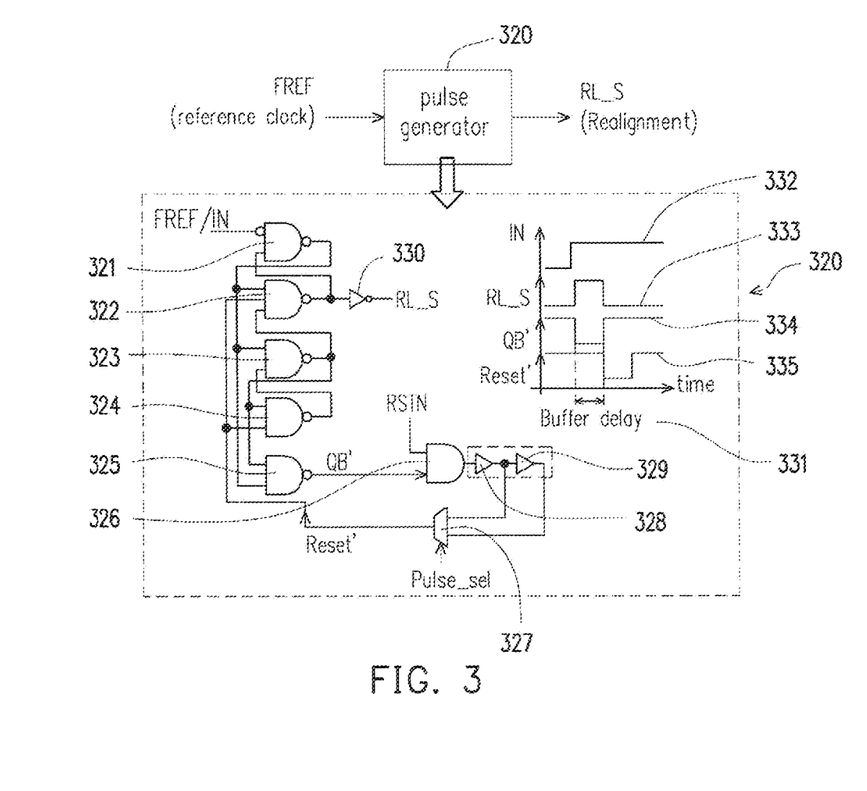
FIG. 3 is a schematic illustration of another pulse generator of realignment and its corresponding timing diagram, in accordance with some embodiments.

FIG. 3 is a schematic diagram of another pulse generator 320 and its corresponding signal timing diagram, according to some embodiments. The pulse generator 320 includes five NAND gates 321, 322, 323, 324, 325, an AND gate 326, a multiplexer 327, a NOT gate 330 and two amplifiers 328 and 329, which are electrically connected with each other as illustrated in FIG. 3. The FREF/IN is an input to the NAND gate 321, the RSTN is an input to the AND gate 326, the Pulse_sel is a selector signal of the multiplexer 327, the RL_S is the output of the inverter 330. The amplifiers 328 and 329 form a buffer which causes a buffer delay 331 when the IN signal is 332. When the IN signal 332 and the RL_S signal 333 have the respective timing as shown in FIG. 3, the resulting QB' signal 334, and the Reset' signal 335 cause a buffer delay 331, as illustrated in FIG. 3. According to some embodiments, the magnitude of the buffer delay 331 is determined by the pulse width of pulse 158. As discussed above, a wide pulse width of pulse 158 provides strong realignment strength.

Figure 4:
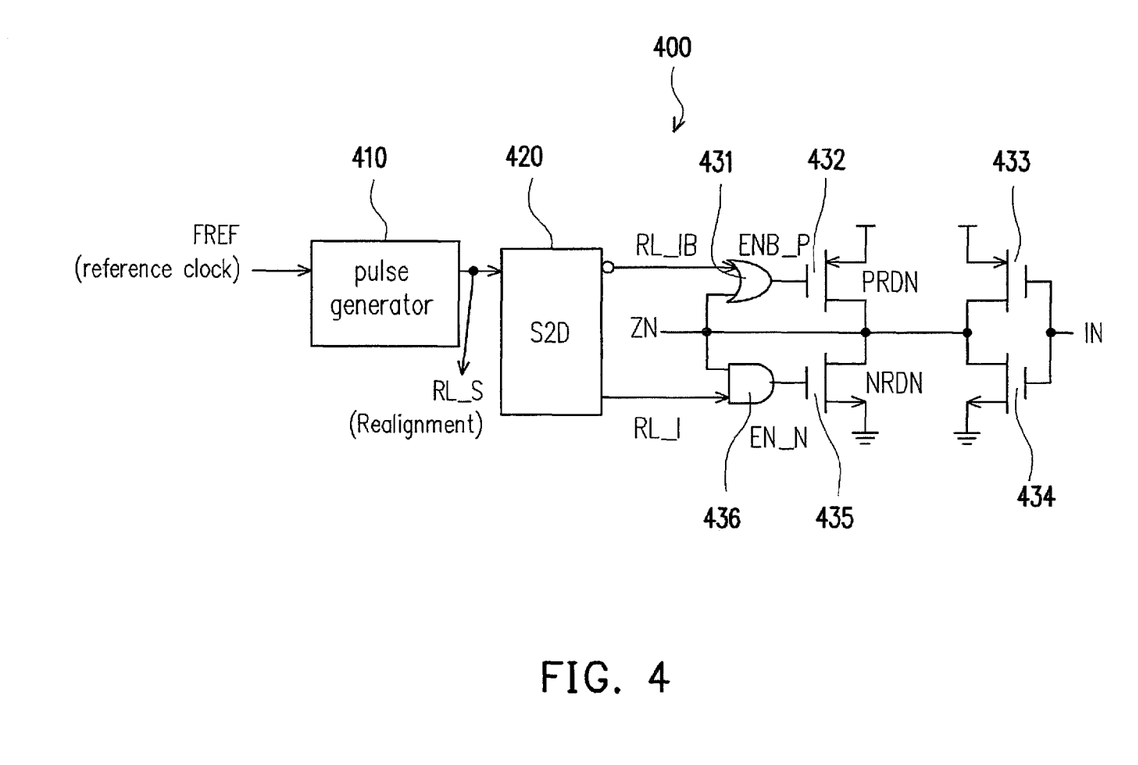
FIG. 4 is a schematic illustration of a full-range realignment ring-cell, in accordance with some embodiments.

FIG. 4 is a schematic illustration of a full-range realignment ring-cell 400, in accordance with some embodiments. According to some embodiments, the full-range realignment ring-cell 400 includes a single-to-differential (S2D) unit 420, for which RL_S is an input, RL_IB is a first output and RL_I is a second output; an OR gate 431, for which the RL_IB is a first input; an AND gate 436, for which the RL_I is a first input; a first PMOS transistor (PRDN) 432 having a gate electrically connected to an output of the OR gate 431; and a first NMOS transistor (NRDN) 435 having a gate electrically connected to an output of the AND gate 436. The drains of the PRDN 432 and the NRDN 435 are electrically connected to each other and are further electrically connected to a second input of the OR gate 431 and a second input of the AND gate 436. According to some embodiments, the full-range realignment ring-cell 400 further includes an inverter with two transistors: a PMOS 433 and an NMOS 434. The gates of the PMOS 433 and NMOS 434 are electrically connected, and the drains of the the PMOS 433 and NMOS 434 are electrically connected. The pulse generator 410 generates RL_S from reference clock FREF. The realignment pulse RL_S is converted to the differentials RL_I and RL_IB by the S2D 420. RL_I is an input to the OR gate 431, and RL_IB is an input to the AND gate 436. The other inputs of the OR gate 431 and the AND-gate 436 are connected to a ZN signal node of the ring oscillator 200. The output of the OR gate 431 and the AND gate 436 are connected to the gate terminals of PRDN 432 and NRDN 435 respectively. The drain terminals of PRDN 432 and NRDN 435 are connected to ZN of the full-range realignment ring oscillator 200.

According to some embodiments, the AND gate 436 and OR gate 431 can detect the level of ZN to decide which device (PRDN 432, or NRDN 435) can be turned on for pulling down or pulling up the signal of ZN. The S2D unit 420 converts the single-ended signal (RL_S) to differential signals (RL_I and RL_IB). The input of the AND gate 436 and the OR gate 431 is connected to the signal of ZN for detecting the level of ZN signal. The other one input of AND gate 436 and the OR gate 431 is connected to the output of the S2D unit 420. The signal ZN at high level disables the OR gate 431 to block signal of RL_IB and the output of the OR gate 431 is pulled to high level for turning off the PRDN 432. The high level ZN enables the AND gate 436 and the signal of RL_I passes through the AND gate 436 to control the NRDN 435.

Figure 5:
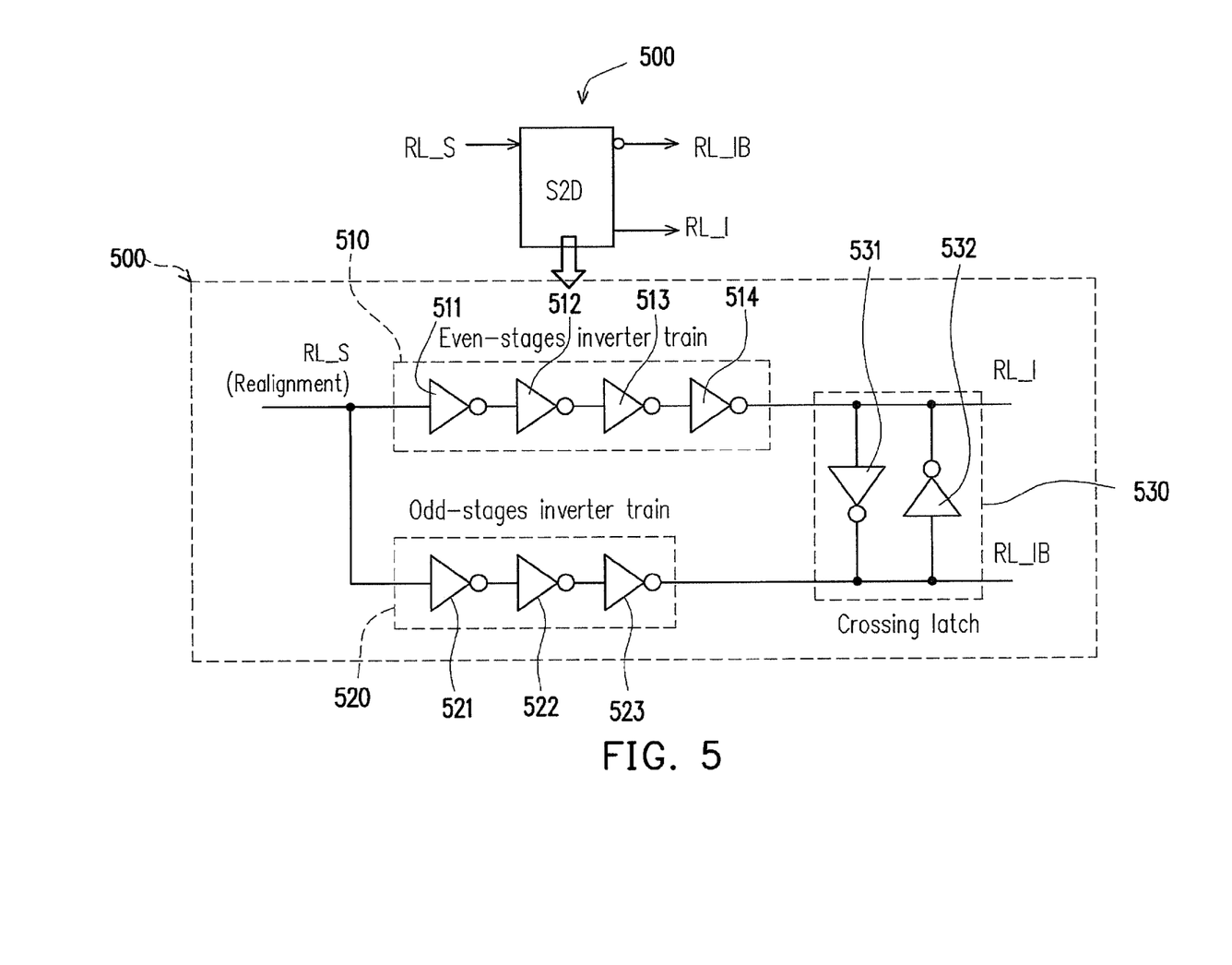
FIG. 5 is a schematic illustration of a single to differential (S2D) unit, in accordance with some embodiments.

FIG. 5 is a schematic illustration of a single to differential (S2D) unit, in accordance with some embodiments. According to some embodiments, the S2D unit 500 converts the single-ended signal (RL_S) to differential signal (RL_I and RL_IB). The S2D unit 500 includes an even-staged inverter train 510, an odd-staged inverter train 520 and a crossing latch unit 530. According to some embodiments, the even-staged inverter train 510 includes an even number (for example, 4) of serially connected inverters: 511, 512, 513, 514. According to some embodiments, the odd-staged inverter train 520 includes an odd number (for example, 3) of serially connected inverters: 521, 522, 523. According to some embodiments, the crossing latch unit 530 includes a pair of cross-connected inverters: 531 and 532. The realignment signal RL_S is connected to the inputs of the even-staged inverter train 510 and the odd-staged inverter train 520. The RL_I is connected to the output of the even-staged inverter train 510 and one side of the crossing latch unit 530. The RL_IB is connected to the output of the odd-staged inverter train 520 and the other side of the crossing latch unit 530. The outputs of the even-staged inverter train 510 and the odd-staged inverter train 520 are connected to the crossing latch unit 530 to correct the phase difference of two outputs to 180 degrees.

Figure 6:
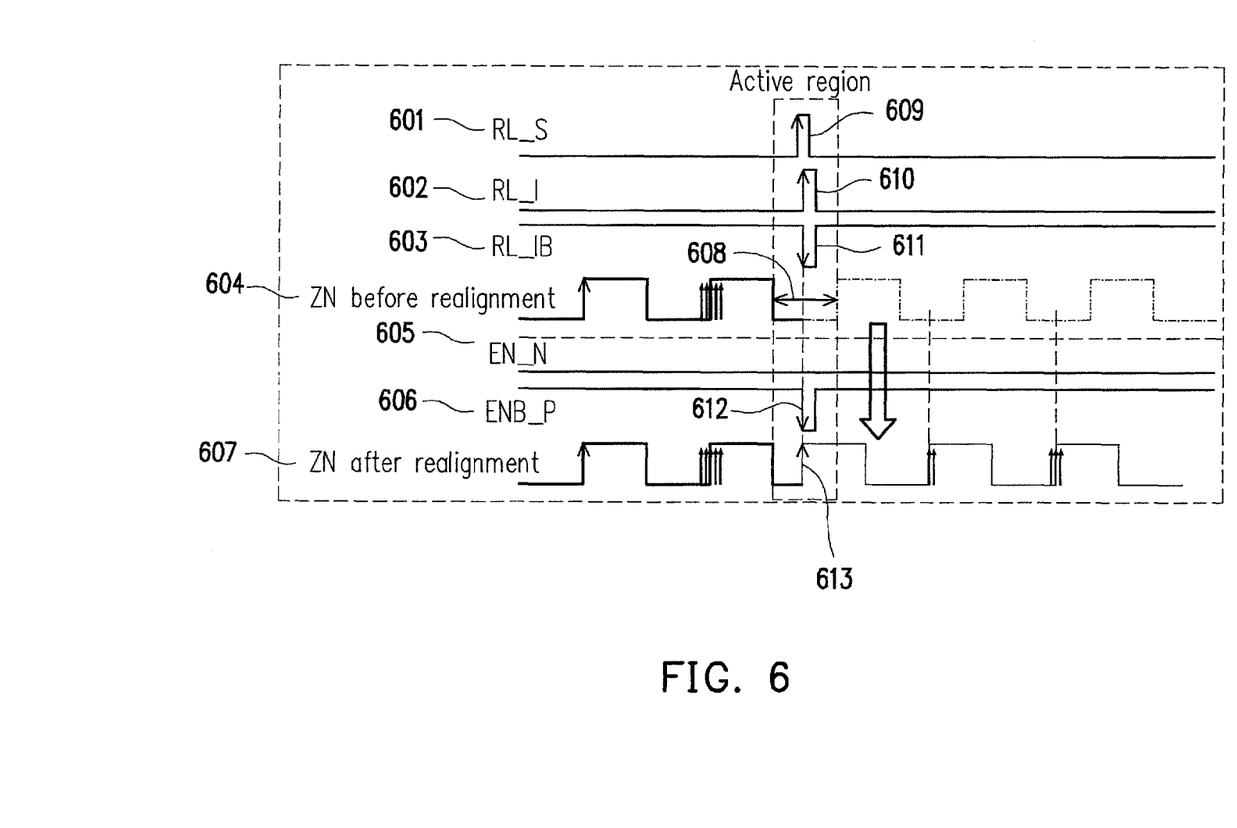
FIG. 6 is a timing diagram of RL_S in negative period of ZN, in accordance with some embodiments.

FIG. 6 is a timing diagram of RL_S in negative period of ZN, in accordance with some embodiments. According to some embodiments, the RL_IB and RL_I levels are high and low, respectively, when the realignment pulse is at low level. When RL_IB is at high level PRDN 432 is disabled, and when RL_I is at a low level NDRN 435 is disabled. When the realignment pulse is received by S2D 420, the RL_IB is at a low level, and RL_I is at a high level. The enablement of PRDN 432 and NRDN 435 is controlled by the ZN signal.

According to some embodiments, when RL_IB is at low level 611 and RL_I at high level 610, they are both in negative period 608 of ZN (low level). As a result, the output (EN_N) of the AND gate 436 stays at low level to disable NRDN 435, and the output (ENB_P) of OR gate 431 stays at low level to enable PRDN 432. Accordingly, the PRDN 432 is turned on to pull the level of ZN to high level from previous low level. As a result, the phase is aligned and the accumulated jitter existed in ring oscillator 200 is reset for suppressing in-band noise of oscillator 200.

According to some embodiments, the level of RL_IB and RL_I are generated respectively by S2D unit 500 which receives the signal of 601 RL_S. The OR-gate 431 and the AND gate 436 receive the signals of ZN, RL_IB and RL_I for generating the ENB_P by OR-gate 431 and the EN_N by the AND gate 436. The PRDN 432 and the NRDN 435 are driven by the ENB_P and EN_N, respectively. The level of RL_IB and RL_I are high and low respectively when the level of RL_S is at low; the PRDN 432 and the NRDN 435 are disabled by RL_IB of high level and RL_I of low level, respectively. In the timing diagram of FIG. 6, the RL_IB of low level and the RL_I of high level are in the negative period of ZN 604 (low level, ZN is one of oscillator nodes). The AND gate 436 (EN_N) keeps output of low level to disable the NRDN 435; and the OR gate 431 (ENB_P) generates a low level to turn on the PRDN 432. The level of ZN is pulled to high from previous low as the PRDN 432 is turned on that reaches the phase alignment and resets the accumulated jitter that existed in the ring oscillator 500 to suppress in-band noise of the oscillator.

Figure 7:
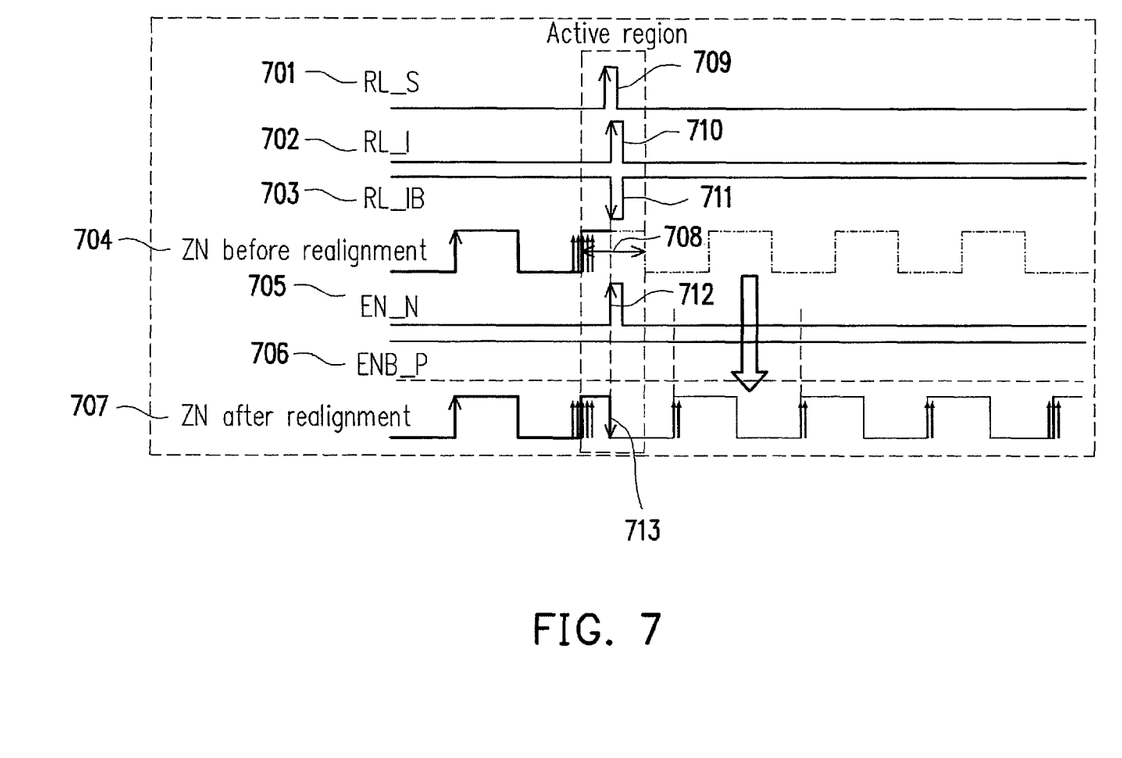
FIG. 7 is a timing diagram of RL_S in positive period of ZN, in accordance with some embodiments.

FIG. 7 is a timing diagram when RL_S is in a positive period of ZN, in accordance with some embodiments. According to some embodiments, when the RL_IB 703 is at a low level and RL_I 702 is at a high level, and both are in a positive period of ZN 704, the OR-gate 431 keeps a high level output in the positive period of ZN 704 to disable the PRDN device 432. The EN_N 705 of a high level is generated by the AND gate 436 when the RL_I 702 is at a high level and the ZN 704 rises to a high level, and the high level EN_N 705 turns on the NRDN device 431. The ZN 704 is dropped to low from a previous high by the enabled NRDN device 431 that can align the phase of oscillator to reset the accumulated jitter for suppressing in-band noise of the oscillator.

Figure 8:
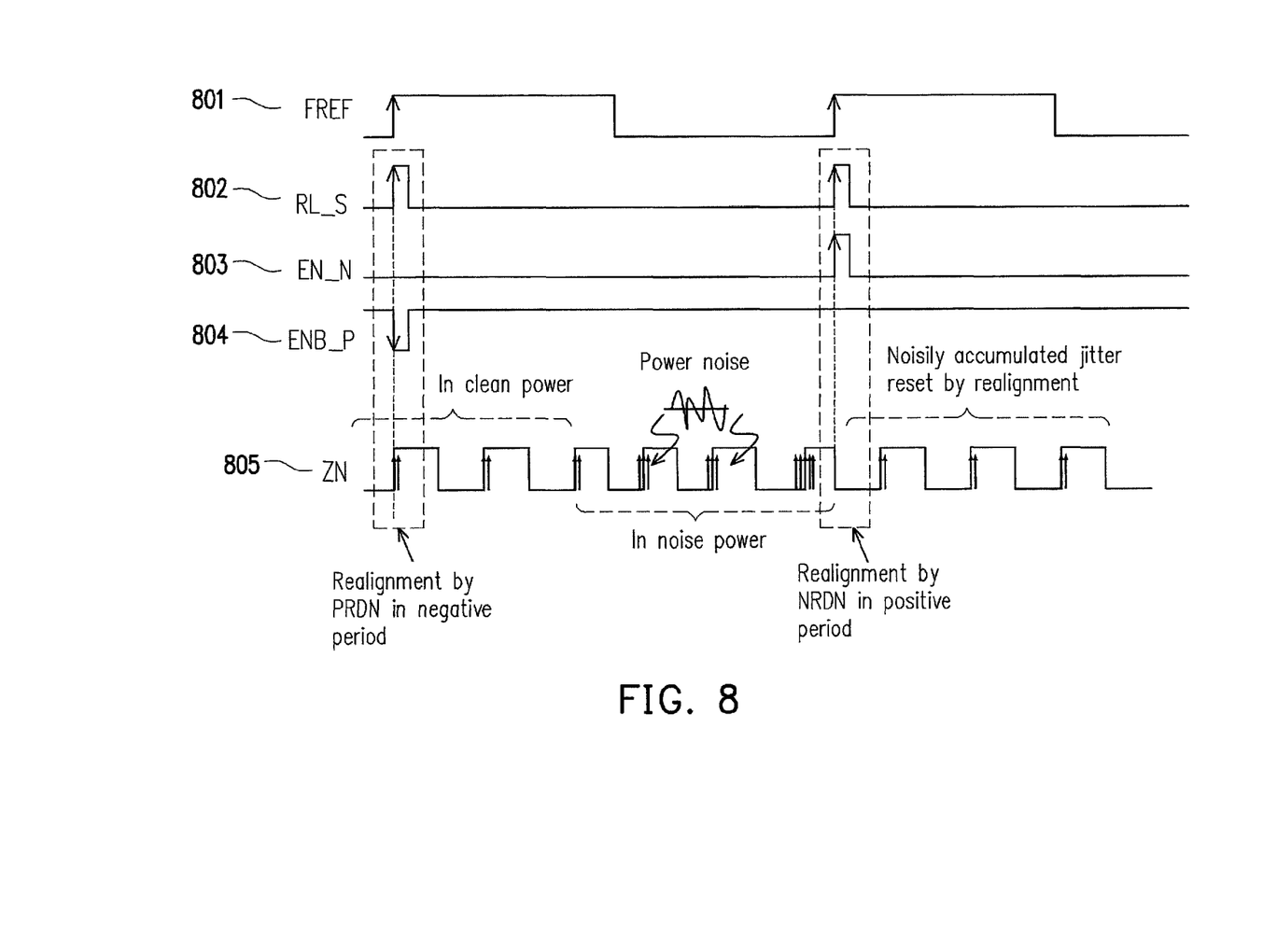
FIG. 8 is a timing diagram illustrating the noise effect, in accordance with some embodiments.

FIG. 8 is a timing diagram illustrating a noise effect, in accordance with some embodiments. According to some embodiments, the full range realignment ring oscillator operates in a clean power mode without any accumulated jitter at the beginning and the phase alignment is achieved by the PRDN 432, which is turned on by the incoming ENB_P 804 of a low level. As shown in FIG. 8, the phase of the oscillator is shifted by jitter as the ring oscillator suffers power noise, and the jitter accumulates in the ring oscillator. When a next low-to-high transition of reference clock signal 801 occurs, the RL_S 802 arrives in the positive period of ZN 805, which was in negative period for the previous RL_S. As a result, the EN_N 803 is pulled to high level and then ENB_P 804 is kept at high. The EN_N 803 of high level turns on the NRDN device 435 to align the phase of oscillator again. As a result, the accumulated jitter of the ring oscillator caused by power noise is reset by the full range realignment ring oscillator.

Figure 9:
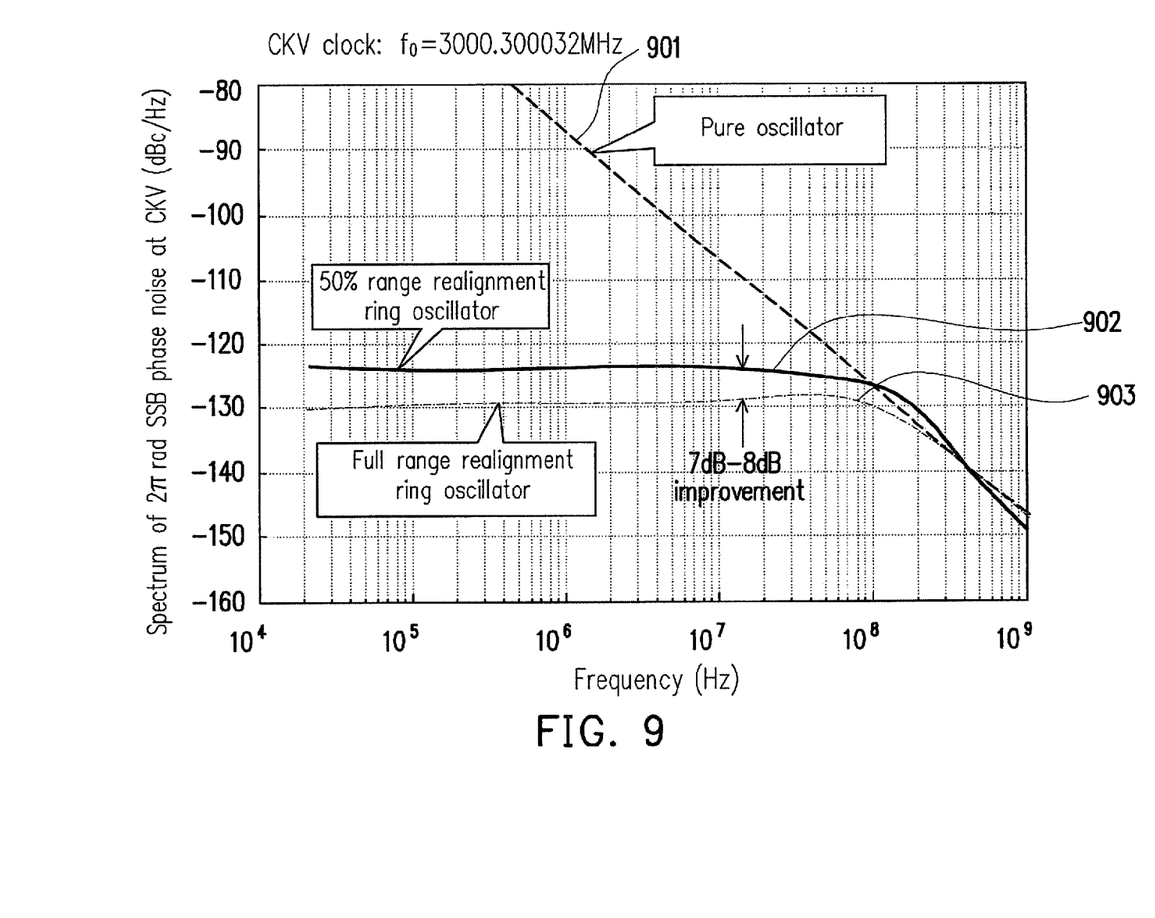
FIG. 9 is a schematic illustration of a comparison of the phase noise suppression, in accordance with some embodiments.

FIG. 9 is a schematic illustration of a comparison of phase noise suppression, in accordance with some embodiments. According to some embodiments, FIG. 9 illustrates a comparison of phase noise among the pure oscillator, the oscillator with 50% realignment and the oscillator with full range realignment. The phase noise of a pure oscillator is represented by curve 901 with −20 dB/decade. The curve 902 of phase noise in the 50% range realignment ring oscillator is similar to the curve of a low-pass filter; the noise floor of in-band noise (<100 MHz) can reach −122 dBc/Hz and the noise floor of out-band noise (>100 MHz) follows the curve of the pure oscillator 901. The curve 903 of phase noise in the full range realignment ring oscillator is similar to the phase noise curve 902 of the 50% range realignment ring oscillator but the noise floor of full range can, reach −130 dBc/Hz for in-band noise.

According to some embodiments, the full range realignment ring oscillator provides full range alignment to reset the accumulated jitter of oscillator and suppress the in-band noise of oscillator at any time, including when the full range realignment ring oscillator suffers from power noise. The full range realignment ring oscillator reduces the in-band noise by at least 8 dB, compared to the conventional 50% range realignment ring oscillator. The full range realignment cell doesn't add additional delay time to impact the frequency of oscillator.

Figure 10:
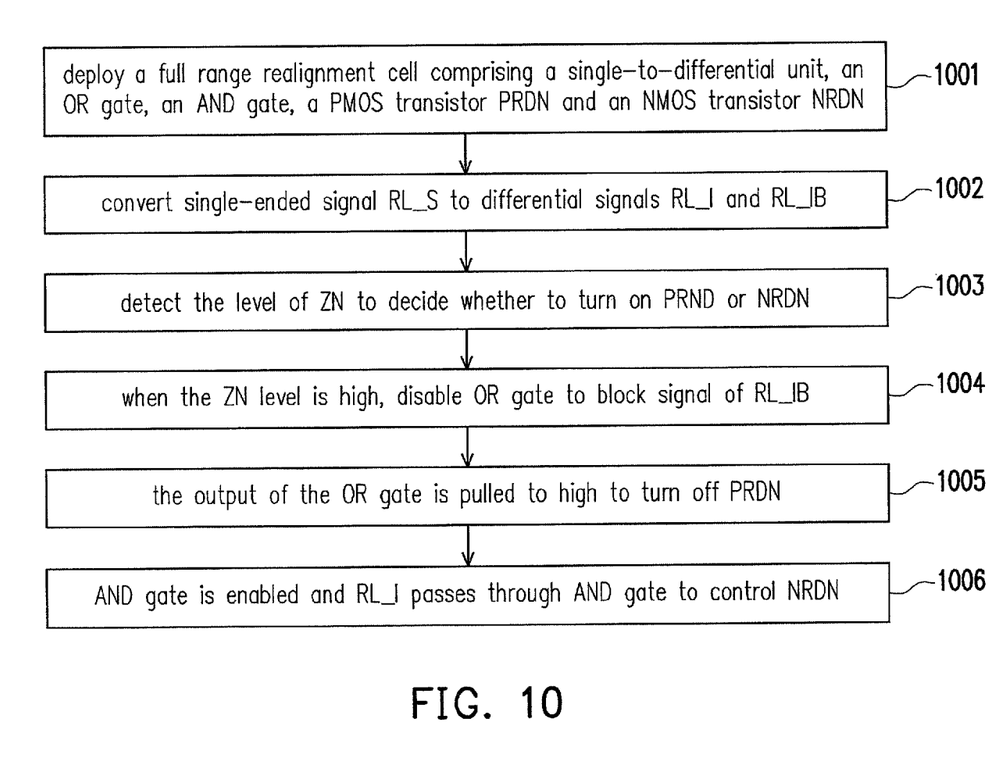
FIG. 10 is a flowchart of the method of operating a full range realignment ring oscillator, in accordance with some embodiments.

FIG. 10 is a flowchart of a method of operating a full range realignment ring oscillator, in accordance with some embodiments. According to some embodiments, the method includes: a first step 1001 of deploying a full range realignment cell. In some embodiments, the full range realignment cell includes a single-to-differential unit, an OR gate, an AND gate, a PMOS transistor PRDN and an NMOS transistor NRDN, as discussed above. In a second step 1002, a single-ended signal RL_S is converted to differential signals RL_I and RL_IB. In a third step 1003, the level of ZN is detected to decide whether to turn on the PRDN or the NRDN. At a fourth step 1004, when the ZN level is high, an OR gate is disabled to block signal of RL_IB. In a fifth step 1005, the output of the OR gate is pulled to high to turn off PRDN. In a sixth step 1006, the AND gate is enable to allow RL_I to pass through the AND gate to control NRDN.

According to some embodiments, a realignment ring-cell circuit is disclosed. The circuit includes a single-to-differential unit, an OR gate, an AND gate, a first P-type metal-oxide-semiconductor transistor, and a first N-type metal-oxide-semiconductor transistor. The single-to-differential unit has an input configured to receive a realignment signal, a first output for outputting a first differential output and a second output for outputting a second differential output. The first output for outputting is a first input to the OR gate. The second output for outputting is a first input to the AND gate. A gate of the P-type metal-oxide-semiconductor transistor is electrically connected to an output of the OR gate. A gate of the N-type metal-oxide-semiconductor transistor is electrically connected to an output of the AND gate. A drain of the P-type metal-oxide-semiconductor transistor and a drain of the N-type metal-oxide-semiconductor transistor are electrically connected to each other and are further electrically connected to a second input of the OR gate and a second input of the AND gate.

According to some embodiments, a full-range realignment ring oscillator circuit is disclosed. The circuit includes a full range realignment ring cell, wherein the full range realignment ring cell has a first input and a second input; and an even number of serially connected ring cells, wherein an output of the full range realignment ring cell is electrically connected to an input of a first ring cell in the even number of serially connected ring cells, wherein an output of the last ring cell in the even number of serially connected ring cells is electrically connected to the first input of the full range realignment ring cell. According to some embodiments, each of the ring cells in the even number of serially connected ring cells is an inverter. According to some embodiments, the second input of the full range realignment ring is electrically connected to a pulse generator.

According to some embodiments, a method for operating a full range realignment ring oscillator is disclosed. The method includes: deploying a full range realignment cell configured to realign a pulse signal with a realignment pulse comprising a single-to-differential unit, an OR gate, an AND gate, a P-type metal-oxide-semiconductor transistor and an N-type metal-oxide-semiconductor transistor; converting a single-ended realignment signal to a first output for outputting a first differential output and a second output for outputting a second differential output; and detecting a level of common drain to decide whether to turn on the P-type metal-oxide-semiconductor transistor or the N-type metal-oxide-semiconductor transistor.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A realignment ring-cell circuit, comprising:
   a single-to-differential unit having an input configured to receive a realignment signal, a first output for outputting a first differential output and a second output for outputting a second differential output;
   an OR gate, wherein the first output for outputting is a first input to the OR gate;
   an AND gate, wherein the second output for outputting is a first input to the AND gate;

a first P-type metal-oxide-semiconductor transistor, wherein a gate of the P-type metal-oxide-semiconductor transistor is electrically connected to an output of the OR gate; and a first N-type metal-oxide-semiconductor transistor, wherein a gate of the N-type metal-oxide-semiconductor transistor is electrically connected to an output of the AND gate, wherein a drain of the P-type metal-oxide-semiconductor transistor and a drain of the N-type metal-oxide-semiconductor transistor are electrically connected to each other and are further electrically connected to a second input of the OR gate and a second input of the AND gate.

2. The realignment ring-cell circuit of claim 1, wherein a source of the P-type metal-oxide-semiconductor transistor is grounded and a source of the N-type metal-oxide-semiconductor transistor is grounded.

3. The realignment ring-cell circuit of claim 1, further comprises a second P-type metal-oxide-semiconductor transistor and a second N-type metal-oxide-semiconductor transistor, wherein the drain of the second P-type metal-oxide-semiconductor transistor and the drain of the second N-type metal-oxide-semiconductor transistor are electrically connected, and are further electrically connected to the drains of both P-type metal-oxide-semiconductor transistor and N-type metal-oxide-semiconductor transistor, wherein the gate of the second P-type metal-oxide-semiconductor transistor and the gate of the second N-type metal-oxide-semiconductor transistor are electrically connected, wherein the source of the second P-type metal-oxide-semiconductor transistor is grounded, wherein the source of the second N-type metal-oxide-semiconductor transistor is grounded.

4. The realignment ring-cell circuit of claim 1, wherein the single-to-differential unit further comprises an even-stage inverter train, an odd-stage inverter train, and a crossing latch.

5. The realignment ring-cell circuit of claim 4, wherein the even-stage inverter train further comprises an even number of serially connected inverters, and the odd-stage inverter train further comprises an odd number of serially connected inverters.

6. The realignment ring-cell circuit of claim 5, wherein the crossing latch further comprises two anti-parallel inverters.

7. The realignment ring-cell circuit of claim 6, wherein the even number is four, and the odd number is three.

8. The realignment ring-cell circuit of claim 7, wherein an input of the first inverter in the even-stage inverter train is electrically connected to an input of the first inverter in the odd-stage inverter train.

9. The realignment ring-cell circuit of claim 8, wherein an output of the last inverter in the even-stage inverter train is electrically connected to a first side of the crossing latch, wherein an output of the last inverter in the odd-stage inverter train is electrically connected to a second side of the crossing latch.

10. A full-range realignment ring oscillator circuit, comprising:

a full range realignment ring cell configured to realign a pulse signal with a realignment pulse, wherein the full range realignment ring cell has a first input and a second input, wherein the full range realignment ring cell comprises a single-to-differential unit having an input configured to receive a realignment signal, a first output and a second output; and an even number of serially connected ring cells, wherein an output of the full range realignment ring cell is electrically connected to an input of a first ring cell in the even number of serially connected ring cells, wherein an output of a last ring cell in the even number of serially connected ring cells is electrically connected to the first input of the full range realignment ring cell.

11. The full-range realignment ring oscillator circuit of claim 10, wherein each of the ring cells in the even number of serially connected ring cells is an inverter.

12. The full-range realignment ring oscillator circuit of claim 10, wherein the second input of the full range realignment ring cell is electrically connected to a pulse generator.

13. The full-range realignment ring oscillator circuit of claim 10, wherein the full range realignment ring cell further comprises:

an OR gate, wherein the first output of the single-to-differential unit is a first input to the OR gate;

an AND gate, wherein the second output of the single-to-differential unit is a first input to the AND gate;

a first P-type metal-oxide-semiconductor transistor, wherein the gate of the P-type metal-oxide-semiconductor transistor is electrically connected to an output of the OR gate; and a first N-type metal-oxide-semiconductor transistor, wherein the gate of the N-type metal-oxide-semiconductor transistor is electrically connected to an output of the AND gate, wherein the drain of the P-type metal-oxide-semiconductor transistor and the drain of the N-type metal-oxide-semiconductor transistor are electrically connected and are further electrically connected to a second input of the OR gate and a second input of the AND gate.

14. The full-range realignment ring oscillator circuit of claim 13, wherein the full range realignment ring cell further comprises a second P-type metal-oxide-semiconductor transistor and a second N-type metal-oxide-semiconductor transistor, wherein the drain of the second P-type metal-oxide-semiconductor transistor and the drain of the second N-type metal-oxide-semiconductor transistor are electrically connected, and are further electrically connected to the drains of both P-type metal-oxide-semiconductor transistor and N-type metal-oxide-semiconductor transistor, wherein the gate of the second P-type metal-oxide-semiconductor transistor and the gate of the second N-type metal-oxide-semiconductor transistor are electrically connected, wherein the source of the second P-type metal-oxide-semiconductor transistor is grounded, wherein the source of the second N-type metal-oxide-semiconductor transistor is grounded.

15. The full-range realignment ring oscillator circuit of claim 13, wherein the single-to-differential unit further comprises an even-stage inverter train, an odd-stage inverter train, and a crossing latch.

16. A method for operating a full range realignment ring oscillator, the method comprises:

deploying a full range realignment cell configured to realign a pulse signal with a realignment pulse comprising a single-to-differential unit, an OR gate, an AND gate, a P-type metal-oxide-semiconductor transistor and an N-type metal-oxide-semiconductor transistor;

converting a single-ended realignment signal to a first output for outputting a first differential output and a second output for outputting a second differential output; and detecting a level of common drain to decide whether to turn on the P-type metal-oxide-semiconductor transistor or the N-type metal-oxide-semiconductor transistor.

17. The method of claim 16, further comprising when the common drain level is high, disabling the OR gate to block the first differential output signal.

18. The method of claim 17, further comprising pulling the output of the OR gate to high.

19. The method of claim 18, further comprising turning off the P-type metal-oxide-semiconductor transistor.

20. The method of claim 19, further comprising enabling the AND gate and passing the second differential output through the AND gate to control the N-type metal-oxide-semiconductor transistor.

* * * * *